United States Patent
Endo et al.

(10) Patent No.: US 12,415,340 B2
(45) Date of Patent: Sep. 16, 2025

(54) SURFACE-TREATED COPPER FOIL

(71) Applicant: NIPPON DENKAI, LTD., Chikusei (JP)

(72) Inventors: Yasuhiro Endo, Chikusei (JP); Shota Moroe, Chikusei (JP); Sayaka Kinoshita, Chikusei (JP)

(73) Assignee: NIPPON DENKAI, LTD., Tokyo (JP)

( * ) Notice: Subject to any disclaimer, the term of this patent is extended or adjusted under 35 U.S.C. 154(b) by 6 days.

(21) Appl. No.: 18/546,748

(22) PCT Filed: Feb. 4, 2022

(86) PCT No.: PCT/JP2022/004464
§ 371 (c)(1),
(2) Date: Aug. 16, 2023

(87) PCT Pub. No.: WO2022/176648
PCT Pub. Date: Aug. 25, 2022

(65) Prior Publication Data
US 2024/0308183 A1    Sep. 19, 2024

(30) Foreign Application Priority Data
Feb. 19, 2021 (JP) ................ 2021-025265

(51) Int. Cl.
*B32B 15/20* (2006.01)
*B32B 3/30* (2006.01)
(Continued)

(52) U.S. Cl.
CPC .......... *B32B 15/20* (2013.01); *B32B 3/30* (2013.01); *B32B 9/00* (2013.01); *B32B 9/04* (2013.01);
(Continued)

(58) Field of Classification Search
CPC . B32B 2311/12; B32B 2307/20; B32B 15/20; B32B 15/01; B32B 15/043;
(Continued)

(56) References Cited

U.S. PATENT DOCUMENTS

2018/0288867 A1* 10/2018 Fukuchi .............. B32B 27/34

FOREIGN PATENT DOCUMENTS

JP    2015061939 A    4/2015
JP    2016089192 A    5/2016
(Continued)

OTHER PUBLICATIONS

"English language translation of International Search Report", International Application No. PCT/JP2022/004464, Mar. 22, 2022, 2 pp.

*Primary Examiner* — Michael E. La Villa
(74) *Attorney, Agent, or Firm* — Myers Bigel, P.A.

(57) ABSTRACT

A surface-treated copper foil which maintains peel strength against the resin substrate of the surface-treated copper foil and achieves desired low transmission loss even at high frequencies includes an electrolytic copper foil, at least one roughened layer that covers one surface of the electrolytic copper foil, an anti-rust layer that covers the at least one roughened layer, and a silane coupling agent-treated layer that covers the anti-rust layer, in which a surface of the surface-treated copper foil on a side of the layers has a developed interfacial area ratio Sdr of 40% or less, an arithmetic mean peak curvature Spc of 200 mm-1 or less and a root mean square gradient Sdq of 0.30 to 0.90, or particles on the surface to be bonded of the surface-treated copper foil have an average particle size of 0.50 μm or less and an average particle length of 0.40 to 0.70 μm.

16 Claims, 4 Drawing Sheets

(51) Int. Cl.
    *B32B 9/00*         (2006.01)
    *B32B 9/04*         (2006.01)
    *B32B 15/01*       (2006.01)
    *B32B 15/04*       (2006.01)
    *B32B 15/08*       (2006.01)
    *C23C 28/00*      (2006.01)
    *C23C 30/00*      (2006.01)
    *C25D 1/04*        (2006.01)
    *C25D 5/00*        (2006.01)
    *C25D 5/10*        (2006.01)
    *C25D 5/48*        (2006.01)
    *C25D 7/00*        (2006.01)
    *C25D 7/06*        (2006.01)
    *H05K 1/03*        (2006.01)

(52) U.S. Cl.
    CPC .............. *B32B 15/01* (2013.01); *B32B 15/04* (2013.01); *B32B 15/043* (2013.01); *B32B 15/08* (2013.01); *C23C 28/00* (2013.01); *C23C 30/00* (2013.01); *C23C 30/005* (2013.01); *C25D 1/04* (2013.01); *C25D 5/10* (2013.01); *C25D 5/48* (2013.01); *C25D 5/605* (2020.08); *C25D 7/00* (2013.01); *C25D 7/06* (2013.01); *H05K 1/03* (2013.01); *B32B 2255/06* (2013.01); *B32B 2255/205* (2013.01); *B32B 2255/24* (2013.01); *B32B 2255/28* (2013.01); *B32B 2307/20* (2013.01); *B32B 2311/12* (2013.01); *Y10T 428/12438* (2015.01); *Y10T 428/12472* (2015.01); *Y10T 428/12493* (2015.01); *Y10T 428/12556* (2015.01); *Y10T 428/12882* (2015.01); *Y10T 428/12903* (2015.01); *Y10T 428/1291* (2015.01); *Y10T 428/12917* (2015.01); *Y10T 428/12993* (2015.01)

(58) Field of Classification Search
    CPC ........... B32B 15/08; B32B 15/04; B32B 3/30; B32B 2255/06; B32B 2255/205; B32B 2255/24; B32B 2255/28; B32B 9/00; B32B 9/04; C23C 28/00; C23C 30/00; C23C 30/005; C25D 1/04; C25D 5/10; C25D 5/48; C25D 5/605; C25D 7/00; C25D 7/06; H05K 1/03; Y10T 428/12903; Y10T 428/1291; Y10T 428/12882; Y10T 428/12917; Y10T 428/12993; Y10T 428/12556; Y10T 428/12438; Y10T 428/12472; Y10T 428/12493
    See application file for complete search history.

(56) References Cited

FOREIGN PATENT DOCUMENTS

| | | |
|---|---|---|
| JP | 2018141228 A | 9/2018 |
| JP | 6462961 B2 | 1/2019 |

* cited by examiner

SURFACE-TREATED COPPER FOIL

RELATED APPLICATIONS

This application is a 35 U.S.C. § 371 national stage application of PCT Application No. PCT/JP2022/004464, filed on Feb. 4, 2022, which claims priority from Japanese Patent Application No. 2021-025265, filed on Feb. 19, 2021, the contents of which are incorporated herein by reference in their entireties. The above-referenced PCT International Application was published in the Japanese language as International Publication No. WO 2022/176648 A1 on Aug. 25, 2022.

BACKGROUND

The present invention relates to a surface-treated copper foil.

BACKGROUND ART

Compared to rolled copper foil, electrolytic copper foil is used in various applications such as printed wiring boards because of its superiority in mass production and relatively low production cost. The Internet, which has been connected to primarily via IT-related devices such as PCs and servers, is now being deployed to everything from clothing (wearable devices) to automobiles (smart cars) and houses (smart houses). Accordingly, there is a need for faster communication speeds and higher capacity.

In order to increase the speed or capacity of communication, the frequency of the electrical signal should be increased. However, a higher frequency of the electrical signal results in a greater loss of signal power (transmission loss), making it difficult to read the data. Transmission loss in electronic circuits can be roughly divided into two types: loss due to copper foil (conductor loss) and loss due to the resin substrate (dielectric loss). Conductor loss is due to the skin effect seen in AC signals and is strongly influenced by the roughness of the copper foil surface. This tendency becomes more pronounced as the frequency of the AC signal increases. Therefore, it is desirable to reduce the surface roughness of the copper foil in order to reduce conductor losses.

Dielectric loss is affected by the adhesive which bonds copper foil to resin substrates. It is thus desirable to bond the copper foil to the resin substrate without using an adhesive. In order to bond the copper foil to the resin substrate without the use of adhesive, the surface of the copper foil to be bonded should be roughened to enhance the adhesion between the copper foil and the resin substrate through the anchor effect. However, as mentioned above, roughening the surface may increase conductor losses, especially at high frequencies. Thus, there is a trade-off between transmission loss and adhesiveness for the surface roughness of the copper foil.

Patent Document 1 discloses a surface-treated copper foil comprising a roughened layer, anti-rust layer and a silane coupling agent-treated layer at least on one surface of copper foil, in that order, with respect to the copper foil, in which the silane coupling agent-treated layer has a developed interfacial area ratio Sdr of 8 to 140% and a root mean square surface gradient Sdq of 25 to 70°, which are composite parameters of three-dimensional surface properties as measured on the surface of the silane coupling agent-treated layer and has an aspect ratio Str of 0.25 to 0.79, which is a space parameter of three-dimensional surface properties as measured on the surface of the silane coupling agent-treated layer.

REFERENCE DOCUMENT LIST

Patent Document

Patent Document 1: JP 6462961 B

SUMMARY OF THE INVENTION

Technical Problem

Patent Document 1 discloses that the surface-treated copper foil achieved excellent transmission loss at a frequency of 40 GHz, but Patent Document 1 does not assess the peel strength relative to the resin substrate. In consideration of the surface roughness disclosed, the copper foil may not have sufficient peel strength.

Thus, an object of the present invention is to provide a surface-treated copper foil which maintains peel strength against the resin substrate of the surface-treated copper foil and achieves desired low transmission loss even at high frequencies.

Solution to Problem

To achieve the above object, an embodiment of the present invention is a surface-treated copper foil comprising an electrolytic copper foil, at least one roughened layer that covers one surface of the electrolytic copper foil, an anti-rust layer that covers the at least one roughened layer, and a silane coupling agent-treated layer that covers the anti-rust layer, in which a surface of the surface-treated copper foil on a side of the layers has a developed interfacial area ratio Sdr of 40% or less, an arithmetic mean peak curvature Spc of 200 mm$^{-1}$ or less and a root mean square gradient Sdq of 0.30 to 0.90.

Another embodiment of the present invention is a surface-treated copper foil including an electrolytic copper foil, at least one roughened layer that covers one surface of the electrolytic copper foil, an anti-rust layer that covers the at least one roughened layer, and a silane coupling agent-treated layer that covers the anti-rust layer, in which particles on a surface of the surface-treated copper foil on a side of the layers have an average particle size of 0.50 μm or less and an average particle length of 0.40 to 0.70 μm.

A yet another embodiment of the present invention is a surface-treated copper foil including an electrolytic copper foil, at least one anti-rust layer that covers one surface of the electrolytic copper foil and a silane coupling agent-treated layer that covers the anti-rust layer, in which a surface of the surface-treated copper foil on a side of the layers has a developed interfacial area ratio Sdr of 40% or less, an arithmetic mean peak curvature Spc of 200 mm$^{-1}$ or less and a root mean square gradient Sdq of 0.20 to 0.90. The surface-treated copper foil may further comprise at least one roughened layer between the electrolytic copper foil and the anti-rust layer.

In any of the above embodiments, the at least one roughened layer is preferably a composite metal layer of copper and at least one metal selected from nickel, cobalt, tin, manganese, tungsten, molybdenum, tantalum, gallium, zinc and phosphorus.

In any of the above embodiments, the at least one roughened layer preferably includes a first roughened layer on the side of the electrolytic copper foil and a second roughened layer that covers the first roughened layer; and the first roughened layer is preferably a composite metal layer of copper and at least one metal selected from molybdenum, zinc, nickel, cobalt, tin, manganese, tungsten, gallium and phosphorus, and the second roughened layer is preferably a layer made of copper.

In any of the above embodiments, the surface-treated copper foil preferably further includes a chromate-treated layer between the anti-rust layer and the silane coupling agent-treated layer.

In any of the above embodiments, the silane coupling agent-treated layer preferably includes an amino silane coupling agent, a vinyl silane coupling agent, a methacryloxy silane coupling agent or an acryloxy silane coupling agent.

Advantageous Effects of Invention

As described above, according to the present invention, by forming at least one roughened layer on one surface of the electrolytic copper foil (the surface to be bonded to the resin substrate), an anti-rust layer thereon, and furthermore, a silane coupling agent-treated layer, and setting the developed interfacial area ratio Sdr of the surface to be bonded to 40% or less, the arithmetic mean peak curvature Spc to 200 $mm^{-1}$ or less, and the root mean square gradient Sdq to 0.30 to 0.90, the particle size of roughening particles formed on the surface to be bonded can be reduced. At the same time, since the roughening particles have a smooth and rounded shape, the peel strength of the surface-treated copper foil against the resin substrate can be maintained and desired low transmission loss can be achieved even at high frequencies.

Furthermore, according to the present invention, by forming at least one roughened layer on one surface of the electrolytic copper foil (the surface to be bonded to the resin substrate), an anti-rust layer thereon and a silane coupling agent-treated layer, and setting the average particle size of particles on the surface to be bonded to 0.50 μm or less and an average particle length to 0.40 to 0.70 μm, the roughening particles with a small particle size and a smooth and rounded shape formed on the surface to be bonded allow the peel strength of the surface-treated copper foil against the resin substrate to be maintained and can achieve desired low transmission loss even at high frequencies.

Moreover, according to the present invention, by forming at least one anti-rust layer on one surface of the electrolytic copper foil (the surface to be bonded to the resin substrate) and further a silane coupling agent-treated layer, and setting the developed interfacial area ratio Sdr of the surface to be bonded to 40% or less, the arithmetic mean peak curvature Spc to 200 $mm^{-1}$ or less, and the root mean square gradient Sdq to 0.20 to 0.90, the particle size of roughening particles formed on the surface to be bonded can be reduced. At the same time, since the roughening particles have a smooth and rounded shape, the peel strength of the surface-treated copper foil against the resin substrate can be maintained and desired low transmission loss can be achieved even at high frequencies.

DETAILED DESCRIPTION

Hereinafter embodiments of the surface-treated copper foil of the present invention and the method for producing the same will be described. However, the present invention is not limited to the embodiments described below.

Surface-Treated Copper Foil

The surface-treated copper foil of the first embodiment includes an electrolytic copper foil, at least one roughened layer that covers one surface of the electrolytic copper foil, an anti-rust layer that covers the at least one roughened layer, and a silane coupling agent-treated layer that covers the anti-rust layer. A surface of the surface-treated copper foil on a side of the layers (i.e., the surface to be bonded to the resin substrate) has a developed interfacial area ratio Sdr of 40% or less, an arithmetic mean peak curvature Spc of 200 $mm^{-1}$ or less and a root mean square gradient Sdq of 0.30 to 0.90.

The developed interfacial area ratio Sdr is one of the parameters of surface roughness and is measured in accordance with ISO 25178. The developed interfacial area ratio Sdr indicates how much the developed area (surface area) of a given region is increased relative to the area of the given region, and is defined by the following formula (unit: %).

Formula 1
$$Sdr = \frac{1}{A}\left[\int\int_A \left(\sqrt{1+\left(\frac{\partial z(x,y)}{\partial x}\right)^2 + \left(\frac{\partial z(x,y)}{\partial y}\right)^2} - 1\right) dxdy\right] \times 100$$

In the formula, x and y are plane coordinates and z is a height coordinate. The z (x, y) represents coordinates on the copper foil surface, and differential of the coordinates provides the slope at that coordinate point. Furthermore, A is a plane area of the region measured. Sdr is 0% when the surface is completely flat, and a larger value means larger irregularities. In the present invention, by setting the developed interfacial area ratio Sdr to 40% or less, particles can be made relatively small and transmission loss can be reduced. The surface-treated copper foil has a developed interfacial area ratio Sdr of preferably 30% or less, and more preferably 25% or less. In addition, when the surface-treated copper foil has a very small developed interfacial area ratio Sdr, particles become too small and may be less adhesive to the resin substrate, and thus, the surface-treated copper foil has a developed interfacial area ratio Sdr of preferably 3% or more, and more preferably 10% or more.

The arithmetic mean peak curvature Spc is another parameter of surface roughness and is measured in accordance with ISO 25178. The arithmetic mean peak curvature Spc represents the arithmetic mean of the principal curvatures of the peaks in a given region and is defined by the following formula (unit: $mm^{-1}$).

$$Spc = -\frac{1}{2}\frac{1}{n}\sum_{k=1}^{n}\left(\frac{\partial^2 z(x, y)}{\partial x^2} + \frac{\partial^2 z(x, y)}{\partial y^2}\right) \quad \text{Formula 2}$$

In the formula, x and y are plane coordinates and z is a height coordinate. The z (x, y) represents coordinates on the copper foil surface, and n represents the number of peaks. The arithmetic mean peak curvature Spc represents the average of reciprocal numbers of the radius of the approximate circle of the peaks of the surface irregularities. A smaller value thereof indicates a rounded and wide peak, whereas a larger value thereof indicates a pointed and narrow peak. In the present invention, by setting the arithmetic mean peak curvature Spc to 200 $mm^{-1}$ or less, the shape of particles can be rounded and transmission loss can be reduced. The surface-treated copper foil has an arithmetic mean peak curvature Spc of more preferably 170 $mm^{-1}$ or less. In addition, when the surface-treated copper foil has a very small arithmetic mean peak curvature Spc, the anchor effect to the resin substrate due to particles may be reduced, and thus, the surface-treated copper foil has an arithmetic mean peak curvature Spc of preferably 90 $mm^{-1}$ or more, and more preferably 120 $mm^{-1}$ or more.

The root mean square gradient Sdq is one of the parameters of surface roughness and is measured in accordance with ISO 25178. The root mean square gradient Sdq represents the root mean square of the slope at all points in a given region and is defined by the following equation (unit: non-dimensional).

$$Sdq = \sqrt{\frac{1}{A}\int\int_A\left[\left(\frac{\partial z(x, y)}{\partial x}\right)^2 + \left(\frac{\partial z(x, y)}{\partial y}\right)^2\right]dxdy} \quad \text{Formula 3}$$

In the formula, x and y are plane coordinates and z is a height coordinate. The z (x, y) represents coordinates on the copper foil surface, and A is the plane area of the measurement region. The square root of the local slope in the x, y direction on an uneven surface is calculated to give the average of the slopes present on the surface. A small root mean square gradient Sdq indicates the presence of a large number of gentle slopes on the surface. A large root mean square gradient Sdq indicates the presence of a large number of steep slopes on the surface. A root mean square gradient Sdq of 0.90 or less provides relatively small particles, and thus, transmission loss can be reduced. The surface-treated copper foil has a root mean square gradient Sdq of preferably 0.85 or less and more preferably 0.70 or less. In addition, when the surface-treated copper foil has a very small root mean square gradient Sdq, the anchor effect to the resin substrate due to particles may be reduced, and thus the surface-treated copper foil should have a root mean square gradient Sdq of 0.30 or more. The surface-treated copper foil has a root mean square gradient Sdq of preferably 0.40 or more, and further preferably 0.50 or more.

By designing the surface to be bonded of the surface-treated copper foil to have a developed interfacial area ratio Sdr of 40% or less, an arithmetic mean peak curvature Spc of 200 $mm^{-1}$ or less and a root mean square gradient Sdq of 0.30 to 0.90, transmission loss can be reduced while maintaining peel strength of the surface-treated copper foil against the resin substrate.

Even when the surface-treated copper foil has a root mean square gradient Sdq of less than 0.30, reduction of the anchor effect to the resin substrate due to particles can be prevented if the surface-treated copper foil has a root mean square gradient Sdq of 0.20 or more. Thus, the same effect of reducing transmission loss while maintaining peel strength of the surface-treated copper foil against the resin substrate as described above can be obtained.

The surface-treated copper foil of the second embodiment includes an electrolytic copper foil, at least one roughened layer that covers one surface of the electrolytic copper foil, an anti-rust layer that covers the at least one roughened layer, and a silane coupling agent-treated layer that covers the anti-rust layer, in which particles on a surface of the surface-treated copper foil on a side of the layers (i.e., the surface to be bonded to the resin substrate) have an average particle size of 0.50 µm or less and an average particle length of 0.40 to 0.70 µm. It is more preferable that the particles have an average particle size of 0.40 µm or less. Reduction of the average particle size as described above makes it possible to reduce transmission loss. The lower limit of the average particle size is not particularly limited, and the lower limit is preferably 0.10 µm or more. Furthermore, it is more preferable that the particles have an average particle length of 0.40 to 0.60 µm. By setting the average particle length to that range, transmission loss can be reduced and peel strength against the resin substrate can be improved.

The average particle size is measured in the observation of the surface to be bonded of the surface-treated copper foil. The average particle length is measured in the observation of a cross-section of the surface-treated copper foil after vertically cutting the copper foil. Both observations may be performed by using a scanning electron microscope (SEM) or the like.

Figure 1:
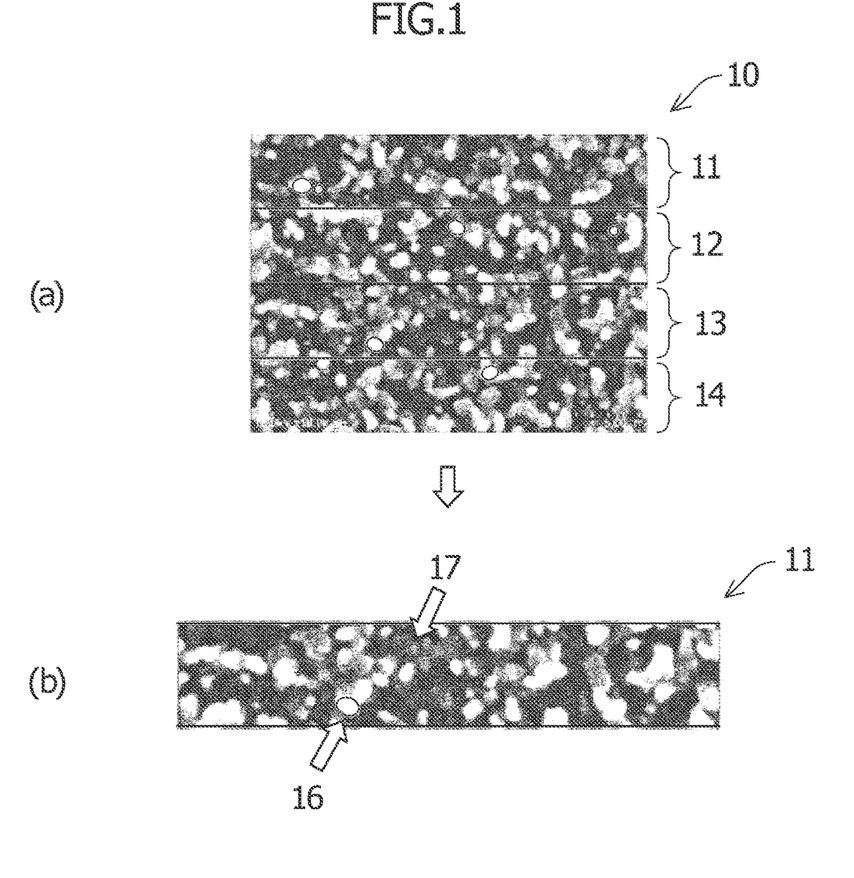
FIG. 1 is a schematic view illustrating the method for measuring the average particle size of particles on the surface to be bonded of the surface-treated copper foil. Subpart (a) shows four horizontal visual fields divided from a SEM image of the surface of the surface-treated copper foil, and subpart (b) shows the largest particle and the smallest particle selected in each of the visual fields.

Referring to the measurement of the average particle size in detail, first a 9.5 µm-long and 12.5 µm-wide SEM image 10 of the surface of surface-treated copper foil is divided into 4 horizontal visual fields 11 to 14 as shown in FIG. 1(a). The largest particle and the smallest particle are selected in the respective visual fields. For example, as shown in FIG. 1(b), the largest particle 16 and the smallest particle 17 are selected in visual field 11. Then the major axis of the largest particle 16 and the smallest particle 17 is measured, respectively. The average of all the values of the major axis of the largest and the smallest particles in the four visual fields 11 to 14 obtained as described above is defined as the average particle size of the surface-treated copper foil.

Figure 2:
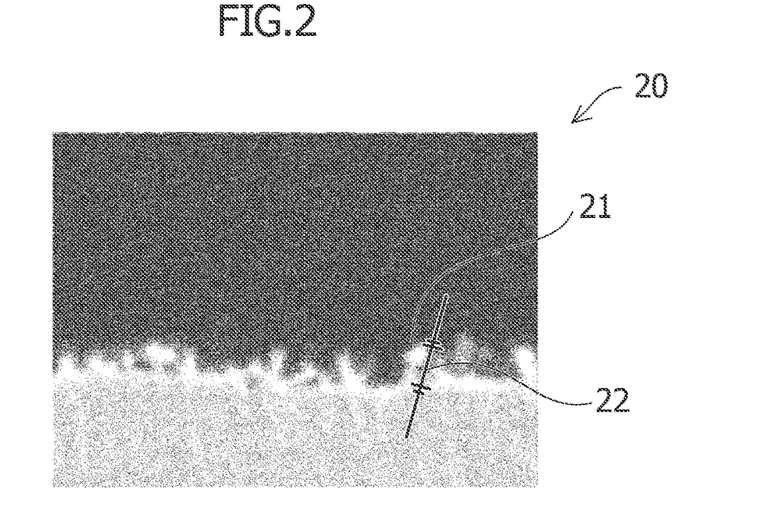
FIG. 2 is a schematic view illustrating the method for measuring the average particle length of particles on the surface to be bonded of the surface-treated copper foil.

For the measurement of the average particle length, surface-treated copper foil is vertically cut and a 9.5 µm-long and 12.5 µm-wide SEM image of the cross section is divided into 4 vertical visual fields as described above. The largest particle and the smallest particle are selected in the respective visual fields. The length of the respective particles is measured, and the average of all the resulting values of the length of the largest and the smallest particles in the four visual fields is defined as the average particle length of the surface-treated copper foil. The length of particles is measured in the direction of the axis 22 of the particle 21 in the SEM image 20 of a cross-section of the surface-treated copper foil as shown in FIG. 2.

The density of particles formed on the surface to be bonded of the surface-treated copper foil, i.e., the number of particles per unit area, is preferably 2.2 to 9.8 particles/$\mu m^2$, more preferably 2.7 to 9.8 particles/$\mu m^2$. By setting the density of particles to those as described above, the channel through which surface current flows becomes short, and this alleviates an increase in the electric resistance on the surface, reduces transmission loss and increases peel strength against the resin substrate.

The density of particles is measured in the observation of the surface to be bonded of the surface treated copper by using a SEM or the like. The number of particles in a visual field is counted in the SEM image of the surface of the surface-treated copper foil, and the value obtained by dividing the number by the area of the visual field is defined as the density of particles of the surface-treated copper foil.

Both the first embodiment and the second embodiment of the surface-treated copper foil of the present invention can achieve low transmission loss desired for copper cladding laminates while maintaining peel strength against the resin substrate of the surface-treated copper foil. In the following, the peel strength between the surface-treated copper foil and the resin substrate and transmission loss of copper cladding laminates will be described in detail.

The peel strength between the surface-treated copper foil and the resin substrate may be measured according to JIS C 5016 1994 (Test methods for flexible printed wiring boards). More specifically, a copper cladding laminate is prepared by stacking a resin substrate on the surface to be bonded of a surface-treated copper foil, and the surface-treated copper foil is peeled off of the resin substrate of the copper cladding laminate in the vertical direction under predetermined conditions, and the average of loads at that time is defined as peel strength (unit: kN/m). The surface-treated copper foil maintains a peel strength of preferably 0.60 kN/m or more, more preferably 0.65 kN/m or more and further preferably 0.70 KN/m or more.

The transmission loss of copper cladding laminates is assessed based on the insertion loss (−20 log |S21|) at a high frequency of 28 GHz. The copper cladding laminate has an insertion loss of preferably higher than −4.40 dB/100 mm, more preferably higher than −4.20 dB/100 mm, and further preferably higher than −4.00 dB/100 mm.

Furthermore, both the first embodiment and the second embodiment of the surface-treated copper foil of the present invention have the structure of the surface-treated copper foil, described later, and may be produced by the method described below. For the surface-treated copper foil of the present invention, as long as the developed interfacial area ratio Sdr, the arithmetic mean peak curvature Spc and the root mean square gradient Sdq on the surface to be bonded are in the predetermined range as illustrated in the first embodiment, the average particle length may exceed the predetermined upper limit of 0.70 $\mu m$ which has been illustrated in the second embodiment, when the surface-treated copper foil has an average particle length of 1.00 $\mu m$ or less. At present, this may be because when the particles have an average particle length of 1.00 $\mu m$ or less, the geometry specified by Sdr, Spc, and Sdq is sufficiently effective for suppressing an increase in electric resistance on the surface, and thus, the desired low transmission loss is achieved. It is more preferable that both the average particle size and the average particle length of the particles on the surface to be bonded be in the predetermined range.

The electrolytic copper foil constituting the surface-treated copper foil of the first and the second embodiments preferably has a thickness of 6 to 35 $\mu m$. When the electrolytic copper foil is thinner than 6 $\mu m$, handling of the electrolytic copper foil may be difficult. When the electrolytic copper foil is thicker than 35 $\mu m$, it may have the disadvantage that fine patterns are difficult to be formed when the electrolytic copper foil is used in applications such as printed wiring boards. The lower limit of the thickness of the electrolytic copper foil is more preferably 8 $\mu m$ or more. The upper limit of the thickness of the electrolytic copper foil is more preferably 18 $\mu m$ or less.

The electrolytic copper foil usually has a shiny cathode surface which was in contact with the electrodeposition drum in the process of manufacture, and a deposition surface formed by plating on the opposite side. Although the above roughened layer may be formed on either of the cathode surface or the deposition surface of the electrolytic copper foil, it is preferable to form the roughened layer on the deposition surface of the electrolytic copper foil.

In order to maintain conductivity, at least one roughened layer constituting the surface-treated copper foil of the first and the second embodiments is preferably a layer made of copper, and is preferably a composite metal layer of copper and at least one metal selected from nickel, cobalt, molybdenum, zinc, tin, manganese, tungsten, tantalum, gallium, and phosphorus.

The ratio between copper and other metals in the composite metal layer is preferably 60% or less of copper and 40% or more in total of other metals in molar ratio, and more preferably 55% or less of copper and 45% or more in total of other metals. The lower limit of the ratio of copper is preferably 25% or more, and more preferably 33% or more. Accordingly, the lower limit of the ratio of other metals is preferably 75% or less, and more preferably 67% or less.

When the surface-treated copper foil has a single roughened layer, the roughened layer is preferably a composite metal layer of copper and at least one metal selected from nickel, cobalt, tin, manganese, tungsten, molybdenum, tantalum, gallium, zinc and phosphorus, and is particularly preferably a composite metal layer made of three metals of copper, nickel and cobalt (to form a composite metal layer, citric acid may be used as a complexing agent, as described in detail later). In that case the roughened layer has a thickness of preferably 0.05 to 0.50 $\mu m$, and more preferably 0.10 to 0.40 $\mu m$.

When the surface-treated copper foil has two roughened layers, the first roughened layer on the side of the electrolytic copper foil is preferably a composite metal layer of copper and at least one metal selected from molybdenum, zinc, nickel, cobalt, tin, manganese, tungsten, tantalum, gallium and phosphorus, and the second roughened layer is preferably a layer made of copper. In particular, the composite metal layer is more preferably a composite metal layer made of the three metals copper, molybdenum, and zinc. Although forming two roughened layers as described above makes the particles comparatively larger than in the case of a single layer, the particle length becomes longer than the particle size, and this can reduce transmission loss and increase peel strength. The first roughened layer may have the same thickness as that in the above case of a single roughened layer. The second roughened layer has a thickness of preferably 0.10 to 2.00 $\mu m$, and more preferably 0.20 to 1.20 $\mu m$.

The second roughened layer may be a plurality of layers made of copper, rather than a single layer of copper. This makes the shape of copper particles complex and improves adhesiveness to resin. When the second roughened layer has a plurality of layers made of copper, the second roughened layer has a total thickness of preferably 2.00 μm or less, and more preferably 1.20 μm or less.

The anti-rust layer constituting the surface-treated copper foil of the first and the second embodiments is preferably a layer containing nickel. To impart heat resistance, the anti-rust layer is preferably a composite metal layer of nickel and at least one metal selected from cobalt, molybdenum, zinc, copper, tin, manganese, tungsten, tantalum, gallium and phosphorus, and is more preferably a composite metal layer made of the three metals nickel, cobalt, and molybdenum. The anti-rust layer has a thickness of preferably 0.05 to 0.50 μm, and more preferably 0.10 to 0.20 μm.

Formation of the roughened layer and the anti-rust layer on the surface to be bonded of the electrolytic copper foil has been described, but the present invention is not limited thereto. The surface-treated copper foil may not have a roughened layer when the surface-treated copper foil has a developed interfacial area ratio Sdr of 40% or less, an arithmetic mean peak curvature Spc of 200 $mm^{-1}$ or less, and a root mean square gradient Sdq of 0.20 to 0.90. In other words, an anti-rust layer may be directly formed on the surface to be bonded of the electrolytic copper foil.

The silane coupling agent-treated layer constituting the surface-treated copper foil of the first and the second embodiments may be a layer formed by treatment with a silane coupling agent, which has been applied to electrolytic copper. The silane coupling agent is not particularly limited. For example, an amino silane coupling agent and an epoxy silane coupling agent are preferably used.

Since the silane coupling agent-treated layer is located on the top of the surface-treated copper foil which is in direct contact with the resin substrate, excellent peel strength against specific resin substrates can be achieved by selecting a silane coupling agent depending on the type of resin of the resin substrate. For example, even if the same type of silane coupling agent is used to form a silane coupling agent-treated layer, peel strength tends to be smaller when a polyphenylene ether (PPE) resin which is suitable for high frequency transmission is used as the resin substrate than using polyimide resin. According to the present invention, when surface roughnesses Sdr, Spc, and Sdq satisfy all the predetermined ranges described above or when particles satisfy all the predetermined ranges of the average particle size and average particle length, excellent peel strength can be obtained by using an amino silane coupling agent, a vinyl silane coupling agent, a methacryloxy silane coupling agent or an acryloxysilane coupling agent even when PPE is used as the resin substrate.

Examples of amino silane coupling agents include 3-aminopropyltrimethoxysilane and 3-aminopropyltriethoxysilane. Examples of vinyl silane coupling agents include vinyltrimethoxysilane and vinyltriethoxysilane. Examples of methacryloxy silane coupling agents include 3-methacryloxypropyltrimethoxysilane and 3-methacryloxypropyltriethoxysilane. Examples of acryloxy silane coupling agent include 3-acryloxypropyltrimethoxysilane and 3-acryloxypropyltriethoxysilane.

The surface-treated copper foil of the first and the second embodiments may have a chromate-treated layer between the anti-rust layer and the silane coupling agent-treated layer as needed. The chromate layer may be formed by chromate treatment which has been applied to electrolytic copper. It is preferable that chrome trioxide, potassium dichromate, sodium dichromate and the like are used for chromate treatment. The chromate-treated layer formed as described above includes oxide or hydroxide of trivalent chromium formed by reduction of hexavalent chromium.

The surface-treated copper foils of the first and the second embodiments have the above structure and thus have a total thickness of more than 6.2 μm, and preferably 8.4 μm or more. The upper limit of the total thickness is 38.0 μm or less, and more preferably 19.8 μm or less.

Method for Producing Surface-Treated Copper Foil

Embodiments of the method for producing the surface-treated copper foils of the first and the second embodiments will be described below. The method for producing the surface-treated copper foil of the present embodiment mainly includes: a step for roughening, a step for anti-rust treatment and a step for treatment with a silane coupling agent.

In the step for roughening, the surface to be bonded of electrolytic copper foil is plated to form at least one roughened layer. This generally determines the developed interfacial area ratio Sdr, arithmetic mean peak curvature Spc and root mean square gradient Sdq on the surface to be bonded of electrolytic copper foil.

It is preferable to use a plating bath containing metal ions of the material of the above composite metal layer to form a composite metal layer of a single roughened layer or a composite metal layer of the first roughened layer of two or more roughened layers.

For example, the specific composition and conditions of the plating bath for forming a composite metal layer of copper, nickel and cobalt may include a concentration of copper of 6.4 to 16.5 g/L, a concentration of nickel of 4.5 to 11.2 g/L, a concentration of cobalt of 8.4 to 16.8 g/L, a pH of 2.0 to 3.4, a temperature of the bath of 25 to 33° C., a current density of 10 to 15 $A/dm^2$ and a treatment time of 2.2 to 2.5 seconds. The source of supply of metals may be any form of an oxide, a sulfate, a nitrate or a carbonate.

When forming a composite metal layer of copper, nickel and cobalt, a complexing agent may be added. Citric acid, citrate, pyrophosphoric acid, pyrophosphate and the like may be used as the complexing agent. When citrate is used as the complexing agent, the specific composition and conditions of the plating bath for forming a composite metal layer of copper, nickel and cobalt may include a concentration of copper of 6.4 to 10.2 g/L, a concentration of nickel of 1.1 to 4.5 g/L, a concentration of cobalt of 5.2 to 8.4 g/L, a concentration of trisodium citrate dihydrate of 20 to 50 g/L, a pH of 5.8 to 6.4, a temperature of the bath of 25 to 33° C., a current density of 2.0 to 4.0 $A/dm^2$ and a treatment time of 2.2 to 2.5 seconds. The source of supply of metals may be any form of an oxide, a sulfate, a nitrate or a carbonate.

Furthermore, the specific composition and conditions of the plating bath for forming a composite metal layer of copper, molybdenum and zinc may include a concentration of copper of 11.5 to 15.3 g/L, a concentration of molybdenum of 0.4 to 2.0 g/L, a concentration of zinc of 7.4 to 14.0 g/L, a pH of 2.3 to 2.8, a temperature of the bath of 27 to 34° C., a current density of 2.8 to 6.1 $A/dm^2$ and a treatment time of 4.0 to 4.6 seconds. The source of supply of metals may be any form of an oxide, a sulfate, a nitrate or a carbonate.

It is preferable to use an acidic copper plating bath to form the second roughened layer. The specific composition and conditions of the plating bath may include a concentration of copper of 25.5 to 45.8 g/L, a concentration of sulfuric acid of 90 to 160 g/L, a temperature of the bath of 27 to 34° C., a current density of 3.5 to 45.0 $A/dm^2$, preferably 3.5 to 6.1 $A/dm^2$, and a treatment time of 16 to 20 seconds. The source of supply of metals may be any form of an oxide, a sulfate, a nitrate or a carbonate.

In the step for forming a roughened layer, the electrolytic copper foil may be washed with water or pickled before plating.

In the step for anti-rust treatment, an anti-rust layer is formed on the roughened layer formed on electrolytic copper by plating. By this, the roughened layer is covered with the anti-rust layer. In the case of forming a composite metal layer of nickel, cobalt and molybdenum, the composition and conditions of plating for forming the anti-rust layer may include a concentration of nickel of 1.3 to 5.6 g/L, a concentration of cobalt of 1.0 to 8.4 g/L, a concentration of molybdenum of 0.4 to 2.0 g/L, a pH of 5.8 to 6.4, a temperature of the bath of 27 to 34° C., at a current density of 1.6 to 4.0 A/dm$^2$ and a treatment time of 2.6 to 4.2 seconds. The source of supply of metals may be any form of an oxide, a sulfate, a nitrate or a carbonate.

In the step for anti-rust treatment, it is preferable that the electrolytic copper foil be previously washed with water before plating the surface of the roughened layer of the electrolytic copper foil. Furthermore, after the anti-rust treatment, a treatment with a silane coupling agent is performed as described above. Furthermore, a chromate treatment may be performed before the treatment with a silane coupling agent. For the conditions of the chromate treatment and the treatment with a silane coupling agent, known conditions used for electrolytic copper foil may be used as described above.

EXAMPLES

Hereinafter the present invention will be described in more detail with reference to Examples and Comparative Examples. However, the present invention is not limited to the following Examples.

Example 1

First, a 11.4 μm-thick electrolytic copper foil (made by Nippon Denkai, Ltd., Product No. HL-12) was pickled by dipping in 10% by weight sulfuric acid for 10 seconds. The copper foil was washed with water, and the surface to be bonded of the electrolytic copper foil was plated using a plating solution prepared by adding metal salts so that the concentration of copper was 10.2 g/L, the concentration of nickel was 7.8 g/L and the concentration of cobalt was 11.9 g/L and adjusting the pH to 3.2 and the bath temperature to 30° C., at a current density of 11.0 A/dm$^2$ for 2.5 seconds to form a composite metal layer made of copper, nickel and cobalt as a roughened layer.

Next, the copper foil was washed with water, and the roughened layer of the electrolytic copper foil was plated using a plating solution prepared by adding metal salts so that the concentration of nickel was 2.3 g/L, the concentration of cobalt was 6.1 g/L and the concentration of molybdenum was 0.9 g/L and adding citrate so that the concentration of citric acid was 16.3 g/L and adjusting the pH to 6.2 and the bath temperature to 30° C., at a current density of 3.1 A/dm$^2$ for 3.1 seconds to form a composite metal layer made of nickel, cobalt and molybdenum as an anti-rust layer.

Next, the copper foil was washed with water, and a chromate-treated layer was formed on the anti-rust layer by dipping in a chromium solution prepared by adding chromate so that the concentration of chromic acid was 2.3 g/L and adjusting the pH to 5.4 and the bath temperature to 28° C., for 10 seconds.

The copper foil was washed with water and a silane coupling agent-treated layer was formed on the chromate-treated layer by dipping in a solution of a silane coupling agent including 0.25% by weight of 3-aminopropyltriethoxysilane for 10 seconds. The resulting surface-treated copper foil had a thickness of 11.8 μm.

Example 2

A surface-treated copper foil was prepared in the same manner as in Example 1 except for forming a composite metal layer made of copper, nickel and cobalt as a roughened layer by using a plating solution prepared by adding metal salts so that the concentration of copper was 8.1 g/L, the concentration of nickel was 2.2 g/L and the concentration of cobalt was 6.7 g/L and adding citrate so that the concentration of citric acid was 15.7 g/L and adjusting the pH to 6.0 and the bath temperature to 30° C., at a current density of 3.0 A/dm$^2$ for 2.5 seconds. The resulting surface-treated copper foil had a thickness of 11.8 μm.

Example 3

First, a 11.4-μm-thick electrolytic copper foil (made by Nippon Denkai, Ltd., Product No. HL-12) was pickled by dipping in 10% by weight sulfuric acid for 10 seconds. The copper foil was washed with water, and the surface to be bonded of the electrolytic copper foil was plated using a plating solution prepared by adding metal salts so that the concentration of copper was 12.7 g/L, the concentration of molybdenum was 0.8 g/L and the concentration of zinc was 13.2 g/L and adjusting the pH to 2.5 and the bath temperature to 30° C., at a current density of 2.8 A/dm$^2$ for 4.3 seconds to form a composite metal layer containing copper, molybdenum and zinc as the first roughened layer.

Next, the copper foil was washed with water, and the first roughened layer of the copper foil was plated using a plating solution prepared by adding copper salt so that the concentration of copper was 33.1 g/L and adding 130 g/L of free sulfuric acid and adjusting the bath temperature to 30° C., at a current density of 3.5 A/dm$^2$ for 18 seconds to form the second roughened layer made of copper.

Next, the copper foil was washed with water, and the second roughened layer of the copper foil was plated using a plating solution prepared by adding metal salts so that the concentration of nickel was 4.2 g/L, the concentration of cobalt was 1.4 g/L and the concentration of molybdenum was 0.9 g/L and adding citrate so that the concentration of citric acid was 17.0 g/L and adjusting the pH to 6.2 and the bath temperature to 30° C., at a current density of 2.7 A/dm$^2$ for 3.1 seconds to form a composite metal layer made of nickel, cobalt and molybdenum as an anti-rust layer.

Next, the copper foil was washed with water, and a chromate-treated layer was formed on the anti-rust layer by dipping in a chromium solution prepared by adding chromate so that the concentration of chromic acid was 2.3 g/L and adjusting the pH to 5.4 and the bath temperature to 28° C., for 10 seconds.

The copper foil was washed with water and a silane coupling agent-treated layer was formed on the chromate-treated layer by dipping in a solution of a silane coupling agent including 0.25% by weight of 3-aminopropyltriethoxysilane for 10 seconds. The resulting surface-treated copper foil had a thickness of 11.9 μm.

Example 4

A surface-treated copper foil was prepared in the same manner as in Example 3 except for forming a composite metal layer containing copper, molybdenum and zinc as the first roughened layer by plating the surface to be bonded of the copper foil using a plating solution prepared by adding metal salts so that the concentration of copper was 12.7 g/L, the concentration of molybdenum was 0.8 g/L and the concentration of zinc was 13.2 g/L and adjusting the pH to 2.5 and the bath temperature to 30° C., at a current density of 4.8 A/dm$^2$ for 4.3 seconds and forming a layer made of copper as the second roughened layer by plating using a plating solution prepared by adding copper salts so that the concentration of copper was 33.1 g/L and adding 130 g/L free sulfuric acid and adjusting the bath temperature to 30° C., at a current density of 6.1 A/dm$^2$ for 18 seconds. The resulting surface-treated copper foil had a thickness of 12.3 μm.

Example 5

A surface-treated copper foil was prepared in the same manner as in Example 3 except for forming a composite metal layer containing copper, molybdenum and zinc as the first roughened layer by plating the surface to be bonded of the copper foil using a plating solution prepared by adding metal salts so that the concentration of copper was 12.7 g/L, the concentration of molybdenum was 0.8 g/L and the concentration of zinc was 11.4 g/L and adjusting the pH to 2.5 and the bath temperature to 30° C., at a current density of 4.8 A/dm$^2$ for 4.3 seconds and forming a layer made of copper as the second roughened layer by plating using a plating solution prepared by adding copper salts so that the concentration of copper was 33.1 g/L and adding 130 g/L free sulfuric acid and adjusting the bath temperature to 30° C., at a current density of 6.1 A/dm$^2$ for 18 seconds. The resulting surface-treated copper foil had a thickness of 12.0 μm.

Comparative Example 1

A surface-treated copper foil was prepared in the same manner as in Example 3 except for forming a composite metal layer containing copper, molybdenum and zinc as the first roughened layer by plating the surface to be bonded of the copper foil using a plating solution prepared by adding metal salts so that the concentration of copper was 12.7 g/L, the concentration of molybdenum was 0.8 g/L and the concentration of zinc was 11.4 g/L and adjusting the pH to 2.5 and the bath temperature to 30° C., at a current density of 4.1 A/dm$^2$ for 4.3 seconds and forming a layer made of copper as the second roughened layer by plating using a plating solution prepared by adding copper salts so that the concentration of copper was 33.1 g/L and adding 130 g/L free sulfuric acid and adjusting the bath temperature to 30° C., at a current density of 6.7 A/dm$^2$ for 18 seconds. The resulting surface-treated copper foil had a thickness of 12.1 μm.

Comparative Example 2

A surface-treated copper foil was prepared in the same manner as in Example 3 except for forming a composite metal layer containing copper, molybdenum and zinc as the first roughened layer by plating the surface to be bonded of the copper foil using a plating solution prepared by adding metal salts so that the concentration of copper was 12.7 g/L, the concentration of molybdenum was 0.8 g/L and the concentration of zinc was 11.4 g/L and adjusting the pH at 2.5 and the bath temperature to 30° C., at a current density of 3.3 A/dm$^2$ for 5.4 seconds and forming a layer made of copper as the second roughened layer by plating using a plating solution prepared by adding copper salts so that the concentration of copper was 33.1 g/L and adding 130 g/L of free sulfuric acid and adjusting the bath temperature to 30° C., at a current density of 3.3 A/dm$^2$ for 23 seconds. The resulting surface-treated copper foil had a thickness of 12.2 μm.

Comparative Example 3

A surface-treated copper foil was prepared in the same manner as in Example 3 except for forming a composite metal layer containing copper, molybdenum and zinc as the first roughened layer by plating the surface to be bonded of the copper foil using a plating solution prepared by adding metal salts so that the concentration of copper was 12.7 g/L, the concentration of molybdenum was 0.8 g/L and the concentration of zinc was 11.4 g/L and adjusting the pH to 2.5 and the bath temperature to 30° C., at a current density of 4.8 A/dm$^2$ for 4.3 seconds; forming a layer made of copper as the second roughened layer by plating the surface to be bonded of the copper foil using a plating solution prepared by adding copper salts so that the concentration of copper was 33.1 g/L and adding 130 g/L of free sulfuric acid and adjusting the bath temperature to 30° C., at a current density of 5.8 A/dm$^2$ for 18 seconds; and forming a composite metal layer made of copper and nickel using a plating solution prepared by adding metal salts so that the concentration of copper was 7.9 g/L and the concentration of nickel was 13.4 g/L and adjusting the pH to 1.9 and the bath temperature to 30° C., at a current density of 2.5 A/dm$^2$ for 2.5 seconds. The resulting surface-treated copper foil had a thickness of 12.2 μm.

Comparative Example 4

A surface-treated copper foil was prepared in the same manner as in Comparative Example 3 except for forming a layer made of copper by plating the surface to be bonded of the copper foil using a plating solution prepared by adding copper salt so that the concentration of copper was 33.1 g/L and 130 g/L of free sulfuric acid and adjusting the bath temperature to 30° C., at a current density of 8.7 A/dm$^2$ for 18 seconds. The resulting surface-treated copper foil had a thickness of 12.0 μm.

The surface-treated copper foils of the above Examples 1 to 5 and Comparative Examples 1 to 4 were evaluated by the following method. The results are shown in Table 1.
(1) Measurement of Sdr, Spc, and Sdq The developed interfacial area ratio Sdr, the arithmetic mean peak curvature Spc and the root mean square gradient Sdq of the surface to be bonded of the electrolytic copper foils were measured according to ISO 25178 using a 3D measuring laser microscope (LEXT OLS5000 made by Olympus). The laser wavelength of the light source was 405 nm, the magnification of the objective lens was 100 times (MPLAPON100XLEXT, numerical aperture: 0.95). No filter was used for measuring Sdr and Sdq and a 2.5 μm λc filter was used for measuring Spc. All of Sdr, Spc and Sdq of a 128 μm-long 129-μm-wide two-dimensional region on the surface of the surface-treated copper foil were measured. Sdr, Spc and Sdq of the respective samples were measured at 3 points, and the average value was defined as the value of Sdr, Spc and Sdq, respectively.

(2) Measurement of Particle Diameter and Particle Length

A 9.5 µm-long 12.5 µm-wide two-dimensional region on the surface to be bonded of the surface-treated copper foil was observed at a magnification of 10,000 times using a scanning electron microscope (SEM) ("SU1510" made by Hitachi High-Technologies Corporation). The SEM image of the surface observed was divided into 4 visual fields in the horizontal direction and the major axis of the longest particle and the shortest particle in the respective visual fields was measured. The average of all values of the major axis of the largest particle and the smallest particle in the four visual fields was calculated and defined as the average particle size. The results are shown in Table 1.

Furthermore, the surface-treated copper foil was vertically cut and the profile of a 25.0 µm-long cross-section of the surface to be bonded was observed by the above SEM at a magnification of 10,000 times. The SEM image of the surface observed was divided into 4 visual fields in the horizontal direction and the length of the longest particle and the shortest particle in the respective visual fields was measured. The average of all values of the longest length and the shortest length in the 4 visual fields was calculated and defined as the average particle length. The results are shown in Table 1.

Figure 3:
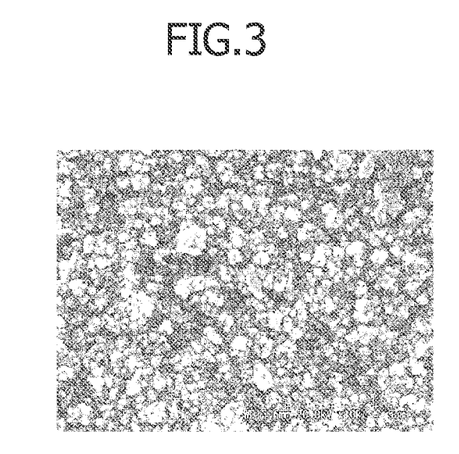
FIG. 3 is a SEM image showing the surface to be bonded of the surface-treated copper foil of Example 1.
Figure 4:
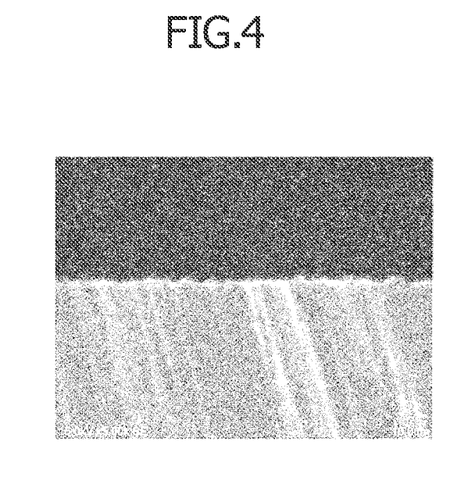
FIG. 4 is a SEM image showing a cross-section of the surface-treated copper foil of Example 1.
Figure 5:
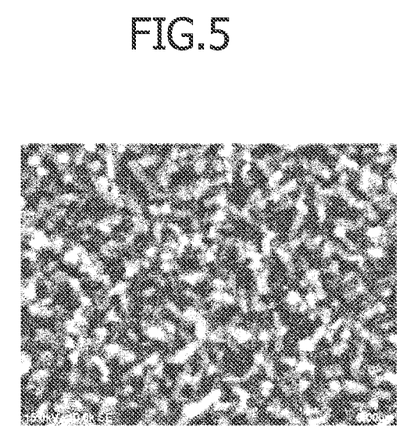
FIG. 5 is a SEM image showing the surface to be bonded of the surface-treated copper foil of Example 3.
Figure 6:
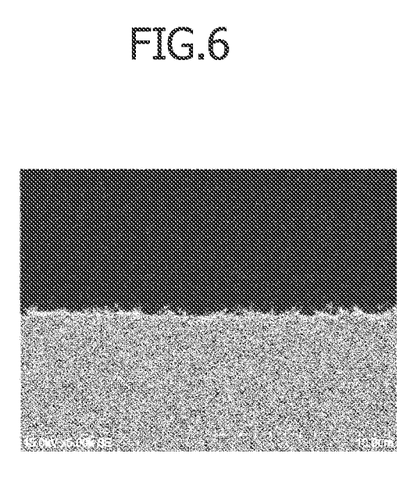
FIG. 6 is a SEM image showing a cross-section of the surface-treated copper foil of Example 3.
Figure 7:
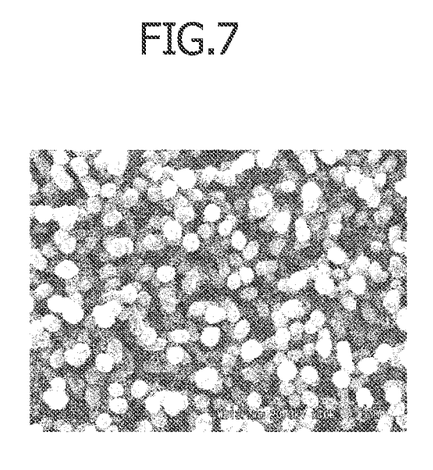
FIG. 7 is a SEM image showing the surface to be bonded of the surface-treated copper foil of Comparative Example 3.
Figure 8:
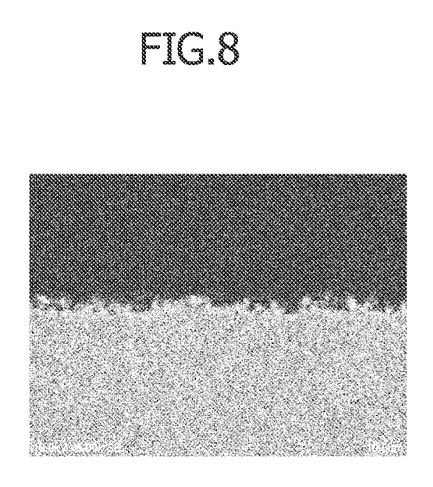
FIG. 8 is a SEM image showing a cross-section of the surface-treated copper foil of Comparative Example 3.

The SEM image of the surface and the cross section in Example 1 is shown in FIG. 3 and FIG. 4, respectively. The SEM image of the surface and the cross section in Example 3 is shown in FIG. 5 and FIG. 6, respectively. The SEM image of the surface and the cross section in Comparative Example 3 is shown in FIG. 7 and FIG. 8, respectively.

(3) Measurement of Density of Particle

The number of particles in a 9.5 µm-long 12.5 µm-wide two-dimensional region of the surface in the above SEM images was counted to calculate the number of particles per unit area. The results are shown in Table 1 as the particle density.

(4) Measurement of Peel Strength

The surface to be bonded of the surface-treated copper foil was laminated with a polyimide substrate (FRS-522 #SW made by KANEKA CORPORATION) to give a copper cladding laminate. The copper cladding laminate was etched so that the width of the copper foil was 1 mm and the peel strength between the surface-treated copper foil and the resin substrate was measured at room temperature according to JIS C 5016 1994 (width of copper: 1 mm).

(5) Measurement of Transmission Loss

The surface to be bonded of the surface-treated copper foil was laminated with liquid crystal polymer (PELLICULE LCP made by Chiyoda Integre Co., Ltd.) and then a copper wiring was formed so that the wiring had a characteristic impedance of 50Ω and a length of 100 mm. Insertion loss (−20 log |S21|) at 28 GHz was measured using those samples by a network analyzer (ZSEX8363B made by Keysight Technologies, Inc.).

TABLE 1

| | Sdr [%] | Spc [mm$^{-1}$] | Sdq [—] | Average particle size [µm] | Average particle length [µm] | Density of particle [particles/µm$^2$] | Peel strength [kN/m] | Insertion loss [dB/100 mm] |
|---|---|---|---|---|---|---|---|---|
| Example 1 | 11.8 | 93.8 | 0.53 | 0.17 | 0.43 | — | 0.7 | −3.8 |
| Example 2 | 4.9 | 162.2 | 0.33 | 0.38 | — | 9.8 | 0.6 | −4.0 |
| Example 3 | 27.0 | 195.8 | 0.84 | 0.37 | 0.54 | 2.2 | 0.8 | −4.0 |
| Example 4 | 24.8 | 161.9 | 0.80 | 0.46 | 0.93 | 2.5 | — | −4.1 |
| Example 5 | 25.6 | 173.4 | 0.81 | 0.45 | 0.63 | 2.7 | 0.9 | −4.4 |
| Comparative Example 1 | 35.0 | 197.1 | 0.98 | 0.45 | 0.73 | 2.7 | — | −4.5 |
| Comparative Example 2 | 35.3 | 220.0 | 0.99 | 0.49 | 0.84 | 2.2 | 0.7 | −4.5 |
| Comparative Example 3 | 41.3 | 219.0 | 1.09 | 0.50 | 0.84 | 2.4 | — | −5.2 |
| Comparative Example 4 | 55.5 | 261.9 | 1.32 | 0.71 | 0.62 | 1.2 | — | −6.3 |

Table 1 shows that the surface-treated copper foil of Examples 1 to 5 of which the surface to be bonded had a developed interfacial area ratio Sdr of 40% or less, an arithmetic mean peak curvature Spc of 200 mm$^{-1}$ or less and a root mean square gradient Sdq of 0.30 to 0.90 had an insertion loss when formed into a copper cladding laminate of greater than-4.50 dB/100 mm and a peel strength against the resin substrate of 0.60 kN/m or more. This confirms that the desired low transmission loss was achieved while maintaining peel strength.

In Examples 1, 3, 5, the particles on the surface to be bonded of the surface-treated copper foil had an average particle size of 0.50 μm or less and an average particle length of 0.40 to 0.70 μm. In addition, in Example 4, the particles had an average particle size of 0.50 μm or less and an average particle length of as long as 0.93 μm. This may be because even when the particles have an average particle length of more than 0.70 μm or more, if an average particle length is 1.00 μm or less and all of the developed interfacial area ratio Sdr, arithmetic mean peak curvature Spc and root mean square gradient Sdq satisfy the predetermined value, the geometry specified by Sdr, Spc, Sdq is sufficiently effective for suppressing an increase in electric resistance on the surface, and thus, the desired low transmission loss was achieved.

In addition, the surface-treated copper foil of Comparative Example 1 with a developed interfacial area ratio Sdr of 40% or less and an arithmetic mean peak curvature Spc of 200 mm$^{-1}$ or less but with a root mean square gradient Sdq of more than 0.90 had an insertion loss when formed into a copper cladding laminate of –4.51 dB/100 mm, failing to achieve the desired low transmission loss. Furthermore, the particles on the surface to be bonded of the surface-treated copper foil of Comparative Example 1 had an average particle size of 0.50 μm or less and an average particle length of 1.00 μm or less, but since they had an average particle length of more than 0.70 μm, the transmission loss was not improved.

The surface-treated copper foil of Comparative Example 2 with a developed interfacial area ratio Sdr of 40% or less but with an arithmetic mean peak curvature Spc of more than 200 mm$^{-1}$ and a root mean square gradient Sdq of more than 0.90 also had an insertion loss of –4.51 dB/100 mm, failing to achieve the desired low transmission loss. Furthermore, the surface-treated copper foils of Comparative Examples 3 and 4 with a developed interfacial area ratio Sdr of more than 40% or less, an arithmetic mean peak curvature Spc of more than 200 mm$^{-1}$ and a root mean square gradient Sdq of more than 0.90 had an insertion loss of –5.24, –6.25 dB/100 mm, failing to achieve the desired low transmission loss. In Comparative Examples 2 and 3, the particles on the surface to be bonded of the surface-treated copper foil had an average particle size of 0.50 μm or less, but an average particle length of more than 0.70 μm. In Comparative Example 4, the particles on the surface to be bonded of the surface-treated copper foil had an average particle length of 0.70 μm or less, but an average particle size of more than 0.50 μm.

Example 6

A 11.4 μm-thick electrolytic copper foil (made by Nippon Denkai, Ltd., Product No. HL-12) was pickled by dipping in 10% by weight sulfuric acid for 10 seconds. The copper foil was washed with water, and the surface to be bonded of the electrolytic copper foil was plated using a plating solution prepared by adding metal salts so that the concentration of copper was 12.7 g/L, the concentration of molybdenum was 0.8 g/L and the concentration of zinc was 13.2 g/L and adjusting the pH to 2.5 and the bath temperature to 30° C., at a current density of 3.4 A/dm$^2$ for 4.3 seconds to form a composite metal layer containing copper, molybdenum and zinc as the first roughened layer. Next, plating was performed using a plating solution prepared by adding copper salt so that the concentration of copper was 33.1 g/L and adding 130 g/L of free sulfuric acid and adjusting the bath temperature to 30° C., at a current density of 1.4 to 40.1 A/dm$^2$ for 18.4 seconds to form a layer made of copper as the second roughened layer.

Next, the copper foil was washed with water, and the fifth roughened layer of the electrolytic copper foil was plated using a plating solution prepared by adding metal salts so that the concentration of nickel was 2.0 g/L, the concentration of cobalt was 6.1 g/L and the concentration of molybdenum was 0.9 g/L and adding citrate so that the concentration of citric acid was 16.3 g/L and adjusting the pH to 6.2 and the bath temperature to 30° C., at a current density of 2.7 A/dm$^2$ for 3.1 seconds to form a composite metal layer made of nickel, cobalt and molybdenum as an anti-rust layer.

Furthermore, the copper foil was washed with water, and a chromate-treated layer was formed on the anti-rust layer by treating with a chromium solution prepared by adding chromate so that the concentration of chromic acid was 2.3 g/L and adjusting the pH to 5.4 and the bath temperature to 28° C., at a current density of 0.8 A/dm$^2$ for 3.0 seconds.

The copper foil was washed with water and a silane coupling agent-treated layer was formed on the chromate-treated layer by dipping in a solution of a silane coupling agent including 0.25 to 1.00% by weight of 3-aminopropyltriethoxysilane for 10 seconds.

The developed interfacial area ratio Sdr, arithmetic mean peak curvature Spc, root mean square gradient Sdq, peel strength and transmission loss of the surface-treated copper foil of Example 6 were also measured.

The peel strength was measured under the same conditions as in the above Examples 1 to 5 and Comparative Examples 1 to 4 except for preparing a copper cladding laminate by laminating a polyphenylene ether (PPE) substrate (Meteorwave 4000 made by AGC-Nelco) on the surface to be bonded of the surface-treated copper foil.

The transmission loss was measured under the same conditions as in the above Examples 1 to 5 and Comparative Examples 1 to 4 except for laminating a PPE substrate (Meteorwave 4000 made by AGC-Nelco) on the surface to be bonded of the surface-treated copper foil and then forming a copper wiring so that the wiring had a characteristic impedance of 50Ω and a length of 100 mm.

Furthermore, the arithmetic average height Sa and the maximum height Sz were measured according to ISO 25178 as the surface roughness of the surface-treated copper foil. The arithmetic mean height Sa is the average of the absolute values of the difference between the height of the respective sites and the average height of the surface. The maximum height Sz is the distance between the highest point and the lowest point in a surface in the direction of the height. Both Sa and Sz were measured in the same manner as in the measurement of Sdr, Spc, Sdq by using a 3D measuring laser microscope (LEXT OLS5000 made by Olympus Corporation).

As a result, the surface-treated copper foil of Example 6 before the treatment with a silane coupling agent had an arithmetic mean height Sa of 0.22 to 0.26 μm, a maximum height Sz of 2.43 to 2.94 μm, a developed interfacial area ratio Sdr of 25.8 to 27.9%, an arithmetic mean peak curvature Spc of 168 to 197 mm$^{-1}$ and a root mean square gradient Sdq of 0.81 to 0.84. The surface-treated copper foil had a thickness of 11.9 μm before the treatment with a silane coupling agent. Furthermore, the surface-treated copper foil had a peel strength of 0.50 to 0.52 kN/m (when bonded to a PPE substrate after the treatment with a silane coupling agent).

Example 7

A surface-treated copper foil was prepared in the same manner as in Example 6 except for using 2.0% by weight of vinyltriethoxysilane as a solution of a silane coupling agent. Sa, Sz, Sdr, Spc, Sdq, peel strength and transmission loss of the surface-treated copper foil of Example 7 were also measured in the same manner as in Example 6. The surface-treated copper foil had a peel strength of 0.52 kN/m.

Example 8

A surface-treated copper foil was prepared in the same manner as in Example 6 except for using 0.5 to 1.0% by weight of 3-methacryloxypropyltriethoxysilane as a solution of a silane coupling agent. Sa, Sz, Sdr, Spc, Sdq, peel strength and transmission loss of the surface-treated copper foil of Example 8 were also measured in the same manner as in Example 6. The surface-treated copper foil had a peel strength of 0.54 to 0.57 kN/m.

Example 9

A surface-treated copper foil was prepared in the same manner as in Example 6 except for using 0.5 to 1.0% by weight of 3-acryloxypropyltrimethoxysilane as a solution of a silane coupling agent. Sa, Sz, Sdr, Spc, Sdq, peel strength and transmission loss of the surface-treated copper foil of Example 9 were also measured in the same manner as in Example 6. The surface-treated copper foil had a peel strength of 0.54 to 0.57 kN/m.

No significant difference was observed in the surface roughnesses Sdr, Spc, Sdq of the surface-treated copper foils before and after the treatment with the silane coupling agent in Example 6 to 9. The surface to be bonded of the surface-treated copper foils of Examples 6 to 9 had a developed interfacial area ratio Sdr of 40% or less, an arithmetic mean peak curvature Spc of 200 mm$^{-1}$ or less and a root mean square gradient Sdq of 0.30 to 0.90. Furthermore, the copper cladding laminate prepared by laminating the copper foil on a PPE substrate had a transmission loss of −3.2 dB/100 mm. This shows that both high peel strength and low transmission loss were achieved.

Comparative Example 5

The glossy cathode surface (S surface) of a 11.4 μm-thick electrolytic copper foil (made by Nippon Denkai, Ltd., Product No. HL-12) was pickled by dipping in 10% by weight sulfuric acid for 10 seconds.

The copper foil was washed with water, and a chromate-treated layer was formed on the S surface by treating with a chromium solution prepared by adding chromate so that the concentration of chromic acid was 2.3 g/L and adjusting the pH to 5.4 and the bath temperature to 28° C., at a current density of 0.8 A/dm$^2$ for 10 seconds.

The copper foil was washed with water and a silane coupling agent-treated layer was formed on the chromate-treated layer by dipping in a solution of a silane coupling agent including 0.5 to 1.0% by weight of 3-aminopropyltriethoxysilane for 10 seconds.

Sa, Sz, Sdr, Spc, Sdq, peel strength and transmission loss of the surface-treated copper foil of Comparative Example 5 were also measured in the same manner as in Example 6. As a result, the surface-treated copper foil of Comparative Example 5 before the treatment with a silane coupling agent had an arithmetic mean height Sa of 0.08 μm, a maximum height Sz of 1.40 to 1.58 μm, a developed interfacial area ratio Sdr of 1.55 to 1.70%, an arithmetic mean peak curvature Spc of 79 to 96 mm$^{-1}$, and a root mean square gradient Sdq of 0.17 to 0.18. The surface-treated copper foil had a thickness of 11.4 μm before the treatment with a silane coupling agent. Furthermore, the surface-treated copper foil had a peel strength of as low as 0.12 to 0.19 kN/m (when bonded to a PPE substrate after the treatment with a silane coupling agent).

Comparative Example 6

A surface-treated copper foil was prepared in the same manner as in Comparative Example 5 except for using 0.25 to 1.8% by weight of vinyltrimethoxysilane as a solution of a silane coupling agent. Sa, Sz, Sdr, Spc, Sdq, peel strength and transmission loss of the surface-treated copper foil of Comparative Example 6 were also measured in the same manner as in Example 6. The surface-treated copper foil had a peel strength of as low as 0.03 to 0.22 kN/m.

Comparative Example 7

A surface-treated copper foil was prepared in the same manner as in Comparative Example 5 except for using 1.0 to 2.5% by weight of 3-methacryloxypropyltriethoxysilane as a solution of a silane coupling agent. Sa, Sz, Sdr, Spc, Sdq, peel strength and transmission loss of the surface-treated copper foil of Comparative Example 7 were also measured in the same manner as in Example 6. The surface-treated copper foil had a peel strength of as low as 0.14 to 0.28 KN/m.

Comparative Example 8

A surface-treated copper foil was prepared in the same manner as in Comparative Example 5 except for using 0.5 to 1.0% by weight of 3-acryloxypropyltrimethoxysilane as a solution of a silane coupling agent. Sa, Sz, Sdr, Spc, Sdq, peel strength and transmission loss of the surface-treated copper foil of Comparative Example 8 were also measured in the same manner as in Example 6. The surface-treated copper foil had a peel strength of as low as 0.17 to 0.21 kN/m.

Comparative Example 9

A surface-treated copper foil was prepared in the same manner as in Comparative Example 5 except for using 0.5 to 1.0% by weight of 3-glycidoxypropyltriethoxysilane as a solution of a silane coupling agent. Sa, Sz, Sdr, Spc, Sdq, peel strength and transmission loss of the surface-treated copper foil of Comparative Example 9 were also measured in the same manner as in Example 6. The surface-treated copper foil had a peel strength of as low as 0.10 to 0.14 kN/m.

Comparative Example 10

A surface-treated copper foil was prepared in the same manner as in Comparative Example 5 except for not per-forming the treatment with a silane coupling agent. Sa, Sz, Sdr, Spc, Sdq, peel strength and transmission loss of the surface-treated copper foil of Comparative Example 10 were also measured in the same manner as in Example 6. The surface-treated copper foil had a peel strength of as low as 0.02 kN/m (a PPE substrate was bonded to the chromate treated layer).

No significant difference was observed in the surface roughnesses Sdr, Spc, Sdq of the surface-treated copper foils before and after the treatment with the silane coupling agent in Comparative Examples 5 to 9. The surface to be bonded of the surface-treated copper foils of Comparative Examples 5 to 10 had a developed interfacial area ratio Sdr of 40% or less, an arithmetic mean peak curvature Spc of 200 mm$^{-1}$ or less, but a root mean square gradient Sdq of out of the range of 0.30 to 0.90. Furthermore, no sufficient peel strength against the PPE substrate was obtained as described above.

For the surface-treated copper foils of Examples 6 to 9 and Comparative Examples 5 to 10, the silane coupling agents used, the concentration of the silane coupling agents and the results of measurement of peel strength are summarized in Table 2.

measured in the same manner as in Example 6. The peel strength of a copper cladding laminate prepared by laminating FR-4 resin (GEA-67N made by Showa Denko Materials Co., Ltd.) on the surface to be bonded of the surface-treated copper foil was measured. As a result, the surface-treated copper foil of Example 10 had an arithmetic mean height Sa of 0.08 µm, a maximum height Sz of 1.98 µm, a developed interfacial area ratio Sd of 2.09%, an arithmetic mean peak curvature Spc of 87 mm$^{-1}$ and a root mean square gradient Sdq of 0.20. The resulting surface-treated copper foil had a thickness of 11.4 µm. Furthermore, the surface-treated copper foil had a peel strength of 0.46 kN/m (when bonded to FR-4). The copper cladding laminate had a transmission loss of −3.2 dB/100 mm. This shows that both high peel strength and low transmission loss were achieved.

Example 11

The S surface on the side of the drum of a 11.4 µm-thick electrolytic copper foil (made by Nippon Denkai, Ltd., Product No. HL-12) was pickled by dipping in 10% by weight sulfuric acid for 10 seconds. The copper foil was

TABLE 2

|  | Silane coupling agent | Concentration [wt %] | Peel strength [kN/m] |
| --- | --- | --- | --- |
| Example 6 | 3-aminopropyltriethoxysilane | 0.25 to 1.00 | 0.50 to 0.52 |
| Example 7 | vinyltriethoxysilane | 2.00 | 0.52 |
| Example 8 | 3-methacryloxypropyltriethoxysilane | 0.5 to 1.00 | 0.54 to 0.57 |
| Example 9 | 3-acryloxypropyltrimethoxysilane | 0.5 to 1.00 | 0.54 to 0.57 |
| Comparative Example 5 | 3-aminopropyltriethoxysilane | 0.5 to 1.0 | 0.12 to 0.19 |
| Comparative Example 6 | vinyltriethoxysilane | 0.25 to 1.8 | 0.03 to 0.22 |
| Comparative Example 7 | 3-methacryloxypropyltriethoxysilane | 1.0 to 2.5 | 0.14 to 0.28 |
| Comparative Example 8 | 3-acryloxypropyltrimethoxysilane | 0.5 to 1.0 | 0.17 to 0.21 |
| Comparative Example 9 | 3-glycidoxypropyltrimethoxysilane | 0.5 to 1.0 | 0.10 to 0.14 |
| Comparative Example 10 | None | — | 0.02 |

Example 10

The S surface on the side of the drum of a 1.4-µm-thick electrolytic copper foil (made by Nippon Denkai, Ltd., Product No. HL-12) was pickled by dipping in 10% by weight sulfuric acid for 10 seconds.

Next, the copper foil was washed with water, and the S surface of the electrolytic copper foil was plated using a plating solution prepared by adding metal salts so that the concentration of nickel was 2.0 g/L, the concentration of cobalt was 6.1 g/L and the concentration of molybdenum was 0.9 g/L and adding citrate so that the concentration of citric acid was 16.3 g/L and adjusting the pH to 6.2 and the bath temperature to 30° C., at a current density of 2.7 A/dm$^2$ for 3.1 seconds to form a composite metal layer made of nickel, cobalt and molybdenum as an anti-rust layer.

Next, the copper foil was washed with water, and a chromate-treated layer was formed on the anti-rust layer by treating with a chromate treatment solution prepared by adding chromate so that the concentration of chromic acid was 2.3 g/L and adjusting the pH to 5.4 and the bath temperature to 28° C., at a current density of 0.8 A/dm$^2$ for 3.0 seconds.

The copper foil was washed with water and a silane coupling agent-treated layer was formed on the chromate-treated layer by dipping in a solution of a silane coupling agent including 0.25 to 1.00% by weight of 3-aminopropyltriethoxysilane for 10 seconds.

Sa, Sz, Sdr, Spc, Sdq, peel strength and transmission loss of the surface-treated copper foil of Example 10 were also washed with water, and the surface to be bonded of the electrolytic copper foil was plated using a plating solution prepared by adding metal salts so that the concentration of copper was 7.9 g/L and the concentration of nickel was 13.4 g/L and adjusting the pH to 1.9 and the bath temperature to 30° C., at a current density of 2.5 A/dm$^2$ for 2.5 seconds to form a composite metal layer containing copper and nickel as a roughened layer.

Next, the copper foil was washed with water, and the roughened layer of the copper foil was plated using a plating solution prepared by adding metal salts so that the concentration of nickel was 2.0 g/L, the concentration of cobalt was 6.1 g/L and the concentration of molybdenum was 0.9 g/L and adjusting the pH to 6.2 and the bath temperature to 30° C., at a current density of 2.7 A/dm$^2$ for 3.1 seconds to form a composite metal layer made of nickel, cobalt and molybdenum as an anti-rust layer.

Next, the copper foil was washed with water, and a chromate-treated layer was formed on the anti-rust layer by treating with a chromate treatment solution prepared by adding chromate so that the concentration of chromic acid was 2.3 g/L and adjusting the pH to 5.4 and the bath temperature to 28° C., at a current density of 0.8 A/dm$^2$ for 3.0 seconds.

The copper foil was washed with water and a silane coupling agent-treated layer was formed on the chromate-treated layer by dipping in a solution of a silane coupling agent including 0.25 to 1.00% by weight of 3-aminopropyltriethoxysilane for 10 seconds.

Sa, Sz, Sdr, Spc, Sdq, peel strength and transmission loss of the surface-treated copper foil of Example 11 were also measured in the same manner as in Example 10. As a result, the surface-treated copper foil had an arithmetic mean height Sa of 0.08 μm, a maximum height Sz of 1.96 μm, a developed interfacial area ratio Sdr of 4.13%, an arithmetic mean peak curvature Spc of 101 mm$^{-1}$ and a root mean square gradient Sdq of 0.28. The surface-treated copper foil had a thickness of 11.4 μm. Furthermore, the surface-treated copper foil had a peel strength of 0.66 kN/m (when bonded to FR-4 resin). The copper cladding laminate had a transmission loss of −3.2 dB/100 mm. This shows that both high peel strength and low transmission loss were achieved.

REFERENCE SIGNS LIST

10: SEM image of surface of surface-treated copper foil
11 to 14: Visual field
16: Largest particle
17: Smallest particle
20: SEM image of cross-section of surface-treated copper foil
21: Particle
22: Axis of particle

What is claimed is:

1. A surface-treated copper foil comprising an electrolytic copper foil, at least one roughened layer that covers one surface of the electrolytic copper foil, an anti-rust layer that covers the at least one roughened layer, and a silane coupling agent-treated layer that covers the anti-rust layer,
wherein an outer surface of the surface-treated copper foil on a side of the layers has a developed interfacial area ratio Sdr of 40% or less, an arithmetic mean peak curvature Spc of 200 mm$^{-1}$ or less, and a root mean square gradient Sdq of 0.30 to 0.90.

2. The surface-treated copper foil according to claim 1, wherein the at least one roughened layer is a composite layer of copper and at least one selected from nickel, cobalt, tin, manganese, tungsten, molybdenum, tantalum, gallium, zinc, or phosphorus.

3. The surface-treated copper foil according to claim 1, wherein the at least one roughened layer comprises a first roughened layer on the side of the electrolytic copper foil and a second roughened layer that covers the first roughened layer, and the first roughened layer is a composite layer of copper and at least one selected from molybdenum, zinc, nickel, cobalt, tin, manganese, tungsten, tantalum, gallium, or phosphorus, and the second roughened layer is a layer made of copper.

4. The surface-treated copper foil according to claim 1, further comprising a chromate-treated layer between the anti-rust layer and the silane coupling agent-treated layer.

5. The surface-treated copper foil according to claim 1, wherein the silane coupling agent-treated layer comprises an amino silane coupling agent, a vinyl silane coupling agent, a methacryloxy silane coupling agent or an acryloxy silane coupling agent.

6. A surface-treated copper foil comprising an electrolytic copper foil, at least one anti-rust layer that covers one surface of the electrolytic copper foil and a silane coupling agent-treated layer that covers the anti-rust layer,
wherein an outer surface of the surface-treated copper foil on a side of the layers has a developed interfacial area ratio Sdr of 40% or less, an arithmetic mean peak curvature Spc of 200 mm$^{-1}$ or less, and a root mean square gradient Sdq of 0.20 to 0.90.

7. The surface-treated copper foil according to claim 6, further comprising at least one roughened layer between the electrolytic copper foil and the anti-rust layer.

8. The surface-treated copper foil according to claim 7, wherein the at least one roughened layer is a composite layer of copper and at least one selected from nickel, cobalt, tin, manganese, tungsten, molybdenum, tantalum, gallium, zinc, or phosphorus.

9. The surface-treated copper foil according to claim 7, wherein the at least one roughened layer comprises a first roughened layer on the side of the electrolytic copper foil and a second roughened layer that covers the first roughened layer, and the first roughened layer is a composite layer of copper and at least one selected from molybdenum, zinc, nickel, cobalt, tin, manganese, tungsten, tantalum, gallium, or phosphorus, and the second roughened layer is a layer made of copper.

10. The surface-treated copper foil according to claim 6, further comprising a chromate-treated layer between the anti-rust layer and the silane coupling agent-treated layer.

11. The surface-treated copper foil according to claim 6, wherein the silane coupling agent-treated layer comprises an amino silane coupling agent, a vinyl silane coupling agent, a methacryloxy silane coupling agent or an acryloxy silane coupling agent.

12. A surface-treated copper foil comprising an electrolytic copper foil, at least one roughened layer that covers one surface of the electrolytic copper foil, an anti-rust layer that covers the at least one roughened layer, and a silane coupling agent-treated layer that covers the anti-rust layer,
wherein the anti-rust layer is a composite metal layer of nickel, cobalt, and molybdenum and has a thickness of 0.05 to 0.50 μm,
wherein particles on an outer surface of the surface-treated copper foil on a side of the layers have an average particle size of 0.50 μm or less, and an average particle length of 0.40 to 0.70 μm,
wherein the average particle size is determined by dividing a 9.5 μm-long and 12.5 μm-wide SEM image of the outer surface of the surface-treated copper foil into four horizontal visual fields, selecting a largest particle and a smallest particle in each visual field, measuring a major axis of each of the largest particles and each of the smallest particles, and obtaining an average of all values of the major axes of the largest and the smallest particles in the four visual fields as the average particle size, and
wherein the average particle length is determined by vertically cutting the surface-treated copper foil, dividing a 9.5 μm-long and 12.5 μm-wide SEM image of a cross section of the surface-treated copper foil into four vertical visual fields, selecting the largest particle and the smallest particle in each of the visual fields, measuring a length of each of the largest particles and each of the smallest particles in a direction of the major axis of particle, obtaining an average of all values of the lengths of the largest and the smallest particles in the four visual fields as the average particle length.

13. The surface-treated copper foil according to claim 12, wherein the at least one roughened layer is a composite layer of copper and at least one selected from nickel, cobalt, tin, manganese, tungsten, molybdenum, tantalum, gallium, zinc, or phosphorus.

14. The surface-treated copper foil according to claim 12, wherein the at least one roughened layer comprises a first roughened layer on the side of the electrolytic copper foil and a second roughened layer that covers the first roughened layer, and the first roughened layer is a composite layer of copper and at least one selected from molybdenum, zinc, nickel, cobalt, tin, manganese, tungsten, tantalum, gallium, or phosphorus, and the second roughened layer is a layer made of copper.

15. The surface-treated copper foil according to claim 12, further comprising a chromate-treated layer between the anti-rust layer and the silane coupling agent-treated layer.

16. The surface-treated copper foil according to claim 12, wherein the silane coupling agent-treated layer comprises an amino silane coupling agent, a vinyl silane coupling agent, a methacryloxy silane coupling agent or an acryloxy silane coupling agent.

\* \* \* \* \*

UNITED STATES PATENT AND TRADEMARK OFFICE
CERTIFICATE OF CORRECTION

PATENT NO. : 12,415,340 B2  
APPLICATION NO. : 18/546748  
DATED : September 16, 2025  
INVENTOR(S) : Endo et al.

Page 1 of 1

It is certified that error appears in the above-identified patent and that said Letters Patent is hereby corrected as shown below:

On the Title Page

Item (71) Applicant: Please correct "NIPPON DENKAI, LTD., Chikusei (JP)" to read -- NIPPON DENKAI, LTD., Tokyo (JP) --

Signed and Sealed this  
Thirtieth Day of December, 2025

John A. Squires  
*Director of the United States Patent and Trademark Office*